(12) United States Patent
Lan et al.

(10) Patent No.: US 12,622,203 B2
(45) Date of Patent: May 5, 2026

(54) WAFER CLEANING METHOD AND WAFER CLEANING SYSTEM

(71) Applicant: United Semiconductor (Xiamen) Co., Ltd., Xiamen (CN)

(72) Inventors: Wan Fu Lan, Shamen City (CN); Rong Xin Xu, Shamen City (CN); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 75 days.

(21) Appl. No.: 18/928,169

(22) Filed: Oct. 27, 2024

(65) Prior Publication Data

US 2026/0096379 A1 Apr. 2, 2026

(30) Foreign Application Priority Data

Sep. 27, 2024 (CN) .......................... 202411364290.8

(51) Int. Cl.
*H10P 70/00* (2026.01)
*H10P 72/00* (2026.01)
*H10P 72/76* (2026.01)

(52) U.S. Cl.
CPC ...... *H10P 72/0414* (2026.01); *H10P 72/7618* (2026.01)

(58) Field of Classification Search
None
See application file for complete search history.

(56) References Cited

U.S. PATENT DOCUMENTS

2019/0096706 A1* 3/2019 Kai ..................... H10P 72/0414

* cited by examiner

*Primary Examiner* — Kaj K Olsen
*Assistant Examiner* — Ryan L Coleman
(74) *Attorney, Agent, or Firm* — Winston Hsu

(57) ABSTRACT

A wafer cleaning method includes steps as follows. A wafer including a surface to be washed is provided. A first nozzle and a second nozzle disposed above the surface to be washed are provided. The wafer is rotated. A first fluid and a second fluid are provided to spray onto the surface to be washed respectively through the first nozzle and the second nozzle. The first nozzle and the second nozzle are controlled to move a predetermined distance from a central region of the surface to be washed along a first direction away from the central region. The first nozzle and the second nozzle are controlled to move along a second direction opposite to the first direction to a peripheral region of the surface to be washed.

16 Claims, 4 Drawing Sheets

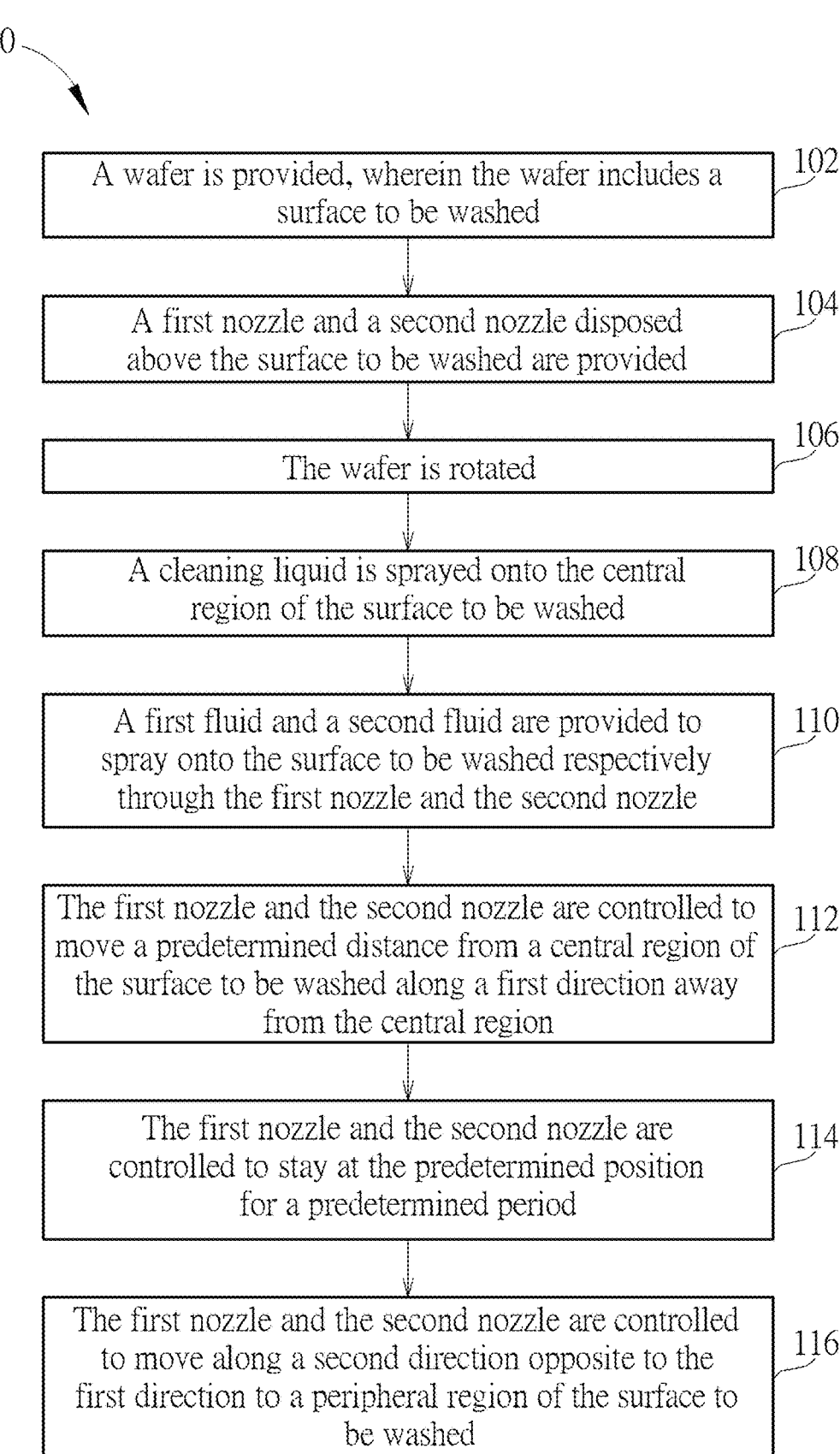

100

| | |
|---|---|
| A wafer is provided, wherein the wafer includes a surface to be washed | 102 |
| A first nozzle and a second nozzle disposed above the surface to be washed are provided | 104 |
| The wafer is rotated | 106 |
| A cleaning liquid is sprayed onto the central region of the surface to be washed | 108 |
| A first fluid and a second fluid are provided to spray onto the surface to be washed respectively through the first nozzle and the second nozzle | 110 |
| The first nozzle and the second nozzle are controlled to move a predetermined distance from a central region of the surface to be washed along a first direction away from the central region | 112 |
| The first nozzle and the second nozzle are controlled to stay at the predetermined position for a predetermined period | 114 |
| The first nozzle and the second nozzle are controlled to move along a second direction opposite to the first direction to a peripheral region of the surface to be washed | 116 |

FIG. 6

WAFER CLEANING METHOD AND WAFER CLEANING SYSTEM

BACKGROUND OF THE INVENTION

1. Field of the Invention

The present disclosure relates to the field of semiconductor devices, and more particularly, to a wafer cleaning method and a wafer cleaning system.

2. Description of the Prior Art

In the field of semiconductors, semiconductor devices may be obtained by applying a plurality of semiconductor processes to a wafer, such as doping processes, deposition processes, developing processes, etching processes and planarization processes. After some of the semiconductor processes are completed, the substances used in the semiconductor processes may remain on the surface of the wafer, such as the etching liquid of the etching process and the photoresist of the development process. Therefore, it is necessary to clean the wafer to keep the surface of the wafer clean.

In general, a liquid spray device can be used to spray the cleaning liquid, such as a specific acidic solution, alkaline solution or deionized water, onto the surface of the wafer, and then the wafer is rotated to remove the residue and the cleaning liquid on the surface of the wafer. However, the centrifugal force at the center of the wafer is much smaller than the centrifugal force in the periphery of the wafer. Accordingly, the residue located at the center of the wafer is not easily removed, which affects the properties and yield of the semiconductor device subsequently formed.

SUMMARY OF THE INVENTION

According to an embodiment of the present disclosure, a wafer cleaning method includes steps as follows. A wafer including a surface to be washed is provided. A first nozzle and a second nozzle disposed above the surface to be washed are provided. The wafer is rotated. A first fluid and a second fluid are provided to spray onto the surface to be washed respectively through the first nozzle and the second nozzle. The first nozzle and the second nozzle are controlled to move a predetermined distance from a central region of the surface to be washed along a first direction away from the central region. The first nozzle and the second nozzle are controlled to move along a second direction opposite to the first direction to a peripheral region of the surface to be washed.

According to another embodiment of the present disclosure, a wafer cleaning system includes a carrier, a first nozzle, a second nozzle, a fluid supply module and a control module. The carrier is for carrying a wafer, wherein the wafer includes a surface to be washed. The first nozzle is disposed above the surface to be washed. The second nozzle is disposed above the surface to be washed. The fluid supply module is connected with the first nozzle and the second nozzle. The control module is connected with the carrier, the first nozzle, the second nozzle and the fluid supply module. The control module is configured to rotate the carrier to bring the wafer to rotate therewith, control the fluid supply module to provide a first fluid and a second fluid to spray onto the surface to be washed respectively through the first nozzle and the second nozzle, control the first nozzle and the second nozzle to move a predetermined distance from a central region of the surface to be washed along a first direction away from the central region, and control the first nozzle and the second nozzle to move along a second direction opposite to the first direction to a peripheral region of the surface to be washed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a flow chart showing steps of a wafer cleaning method according to an embodiment of the present disclosure.

DETAILED DESCRIPTION

In the following detailed description of the embodiments, reference is made to the accompanying drawings which form a part thereof, and in which is shown by way of illustration specific embodiments in which the disclosure may be practiced. In this regard, directional terminology, such as up, down, left, right, front, back, bottom or top is used with reference to the orientation of the Figure(s) being described. The elements of the present disclosure can be positioned in a number of different orientations. As such, the directional terminology is used for purposes of illustration and is in no way limiting. In addition, identical numeral references or similar numeral references are used for identical elements or similar elements in the following embodiments.

Hereinafter, for the description of "the first feature is formed on or above the second feature", it may refer that "the first feature is in contact with the second feature directly", or it may refer that "there is another feature between the first feature and the second feature", such that the first feature is not in contact with the second feature directly.

It is understood that, although the terms first, second, etc. may be used herein to describe various elements, regions, layers and/or sections, these elements, regions, layers and/or sections should not be limited by these terms. These terms may be only used to distinguish one element, region, layer and/or section from another element, region, layer and/or section. Terms such as "first," "second," and other numerical terms when used herein do not imply a sequence or order unless clearly indicated by the context. Thus, a first element, region, layer and/or section discussed below could be termed a second element, region, layer and/or section without departing from the teachings of the embodiments. The terms used in the claims may not be identical with the terms used in the specification, but may be used according to the order of the elements claimed in the claims.

Figure 1:
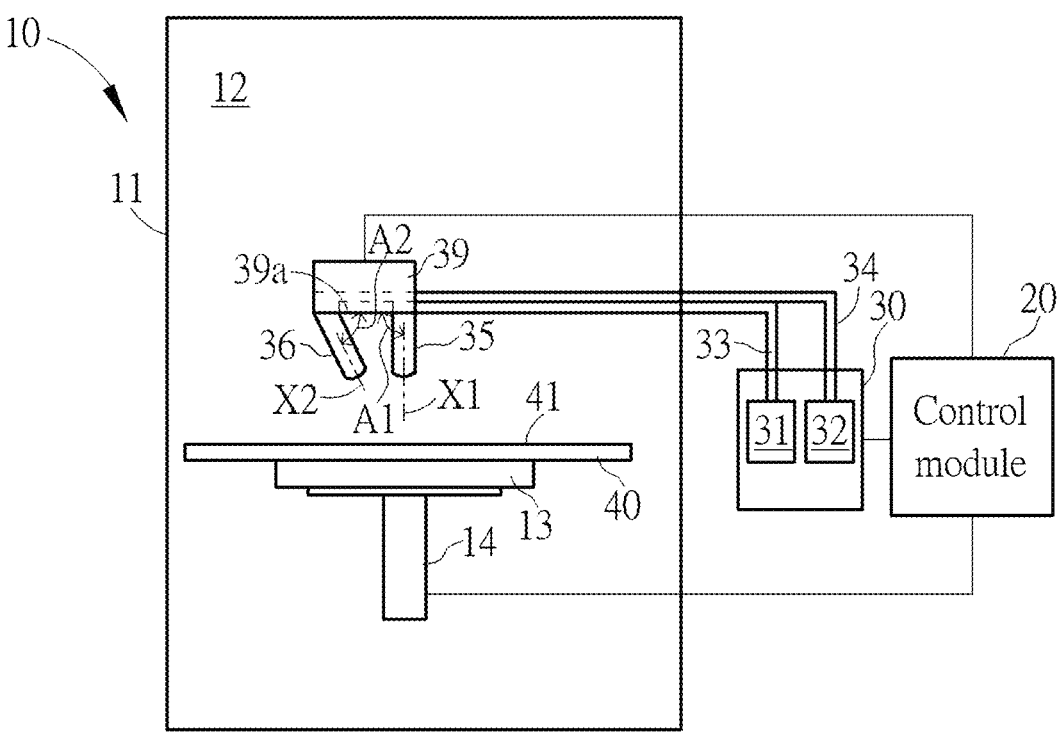
FIG. 1 is a schematic diagram showing a wafer cleaning system according to an embodiment of the present disclosure.

Please refer to FIG. 1, which is a schematic diagram showing a wafer cleaning system 10 according to an embodiment of the present disclosure. The wafer cleaning system 10 includes a carrier 13, a first nozzle 35, a second nozzle 36, a fluid supply module 30 and a control module 20. The carrier 13 is for carrying a wafer 40, wherein the wafer 40 includes a surface 41 to be washed. The first nozzle 35 is disposed above the surface 41 to be washed. The second nozzle 36 is disposed above the surface 41 to be washed. The fluid supply module 30 is connected with the first nozzle 35 and the second nozzle 36. The control module 20 is connected with the carrier 13, the first nozzle 35, the second nozzle 36 and the fluid supply module 30.

Specifically, the control module 20 is configured to control the carrier 13, the first nozzle 35, the second nozzle 36 and the fluid supply module 30, and has capabilities of analysis and calculation. The control module 20 may be, but is not limited to, a central processing unit (CPU). The connection between the control module 20 and each of the carrier 13, the first nozzle 35, the second nozzle 36, and the fluid supply module 30 may be a wired connection or a wireless connection, and may be a direct connection or an indirect connection. Thereby, information can be transmitted between the control module 20, the carrier 13, the first nozzle 35, the second nozzle 36 and the fluid supply module 30. For example, the control module 20 can provide instructions to the carrier 13, the first nozzle 35, the second nozzle 36 and the fluid supply module 30. The aforementioned wireless connection may be, for example, through a wireless personal area network (WPAN) or a wireless local area network (WLAN), but not limited thereto.

The wafer cleaning system 10 may further include a housing 11 and an accommodation space 12 located in the housing 11. The accommodation space 12 may be, for example, an environment in which parameters, such as the temperature and the pressure, are controlled, or an open space. The carrier 13, the first nozzle 35 and the second nozzle 36 may be disposed in the accommodation space 12, and the fluid supply module 30 and the control module 20 may be disposed outside the accommodation space 12.

The wafer cleaning system 10 may further include a rotating shaft 14 connected with the carrier 13. The control module 20 can control the rotating shaft 14 to rotate, so as to bring the carrier 13 to rotate therewith. Thereby, the carrier 13 can bring the wafer 40 to rotate therewith. The rotating shaft 14 may be, for example, an output shaft of a motor (not shown). The wafer 40 may be fixed on the carrier 13 by methods of vacuum attraction, electrostatic attraction or mechanical clamp, etc. The wafer 40 may be, for example, a silicon wafer, and may be in a stage required to be washed after being processed by a semiconductor process.

Figure 3:
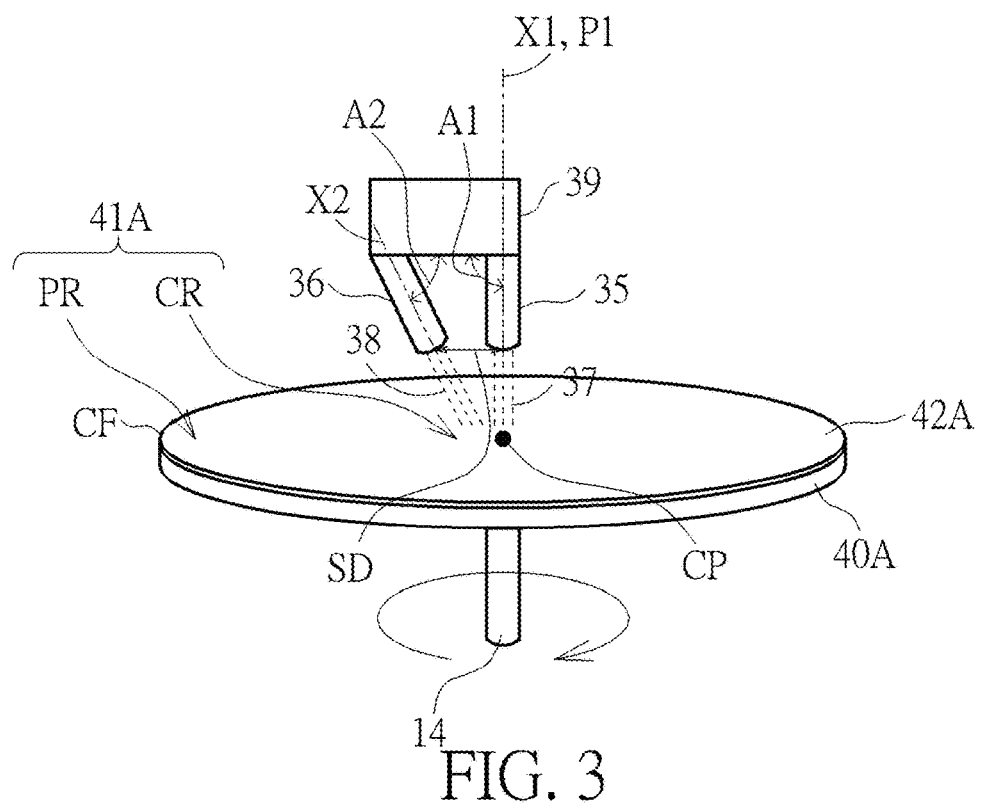

The fluid supply module 30 may include a first fluid source 31 for providing a first fluid 37 (see FIG. 3) and a second fluid source 32 for providing a second fluid 38 (see FIG. 3). According to an embodiment of the present disclosure, the first fluid 37 may be a gas for drying the surface 41 to be washed. The first fluid 37 preferably does not react with the residue on the surface 41 to be washed. Therefore, the first fluid 37 may be a gas with a lower chemical activity, such as nitrogen or an inert gas, such as helium and argon. The second fluid 38 may be a cleaning liquid for cleaning the surface 41 to be washed. For example, the cleaning liquid may dissolve and/or wash away the residue (not shown) on the surface 41 to be washed. According to an embodiment of the present disclosure, the cleaning liquid may be deionized water, but not limited thereto. The cleaning liquid may be selected depending on the properties of the residue.

The wafer cleaning system 10 may further include a first transport tube 33 and a second transport tube 34. The first transport tube 33 connects the first fluid source 31 and the first nozzle 35, so that the first fluid 37 of the first fluid source 31 may be delivered to the first nozzle 35 through the first transport tube 33 and sprayed onto the surface 41 to be washed through the opening at the terminal end of the first nozzle 35. The second transport tube 34 connects the second fluid source 32 and the second nozzle 36, so that the second fluid 38 of the second fluid source 32 may be delivered to the second nozzle 36 through the second transport tube 34 and sprayed onto the surface 41 to be washed through the opening at the terminal end of the second nozzle 36. Each of the first transport tube 33 and the second transport tube 34 may be disposed with a valve (not shown), and the control module 20 can control the type of fluid and the flow rate of the fluid of the fluid supply module 30 to spray onto the surface 41 to be washed by controlling the valves to open or close and the opening degrees of the valves. In FIG. 1, the numbers of the fluid sources, the transport tubes and the nozzles are all two. However, it is only exemplary, and the numbers of the fluid sources, the transport tubes, and the nozzles may be adjusted according to actual needs.

The wafer cleaning system 10 may further include a fixed seat 39. The first nozzle 35 and the second nozzle 36 are disposed at the fixed seat 39. One end of the first transport tube 33 adjacent to the first nozzle 35 is disposed in the fixed seat 39, and one end of the second transport tube 34 adjacent to the second nozzle 36 is disposed in the fixed seat 39. With the fixed seat 39, the control module 20 can move the first nozzle 35 and the second nozzle 36 synchronously by controlling the movement of the fixed seat 39. In other words, with the fixed seat 39, it is beneficial to allow the moving rate of the first nozzle 35 to be identical to the moving rate of the second nozzle 36.

The first nozzle 35 and the second nozzle 36 may be rotatably disposed at the fixed seat 39. Thereby, the included angle A1 between the first nozzle 35 and the fixed seat 39 and the included angle A2 between the second nozzle 36 and the fixed seat 39 may be adjusted, which is beneficial for the first fluid 37 and the second fluid 38 to be sprayed onto the surface 41 to be washed at different angles. In FIG. 1, the included angle A1 between the first nozzle 35 and the fixed seat 39 is 90 degrees. That is, the first nozzle 35 can be disposed vertically on the fixed seat 39. The included angle A2 between the second nozzle 36 and the fixed seat 39 is less than 90 degrees. That is, the second nozzle 36 can be disposed obliquely on the fixed seat 39. The aforementioned included angle A1 may be the minimum included angle between the central axis X1 of the first nozzle 35 and the surface 39a of the fixed seat 39, and the aforementioned included angle A2 may be the minimum included angle between the central axis X2 of the second nozzle 36 and the surface 39a of the fixed seat 39. However, the included angles A1 and A2 shown in FIG. 1 are only exemplary, and may be adjusted according to actual needs, such as according to the requirements of different cleaning stages.

Please refer to FIG. 2 to FIG. 5, which are schematic diagrams showing steps of a wafer cleaning method according to an embodiment of the present disclosure. In FIG. 2 to FIG. 5, the wafer 40A is cleaned with the wafer cleaning system 10 shown in FIG. 1. For the sake of simplicity, some components of the wafer cleaning system 10 are omitted in FIG. 2 to FIG. 5. For example, the control module 20, the fluid supply module 30, the first transport tube 33 and the second transport tube 34 are omitted.

In FIG. 2 to FIG. 5, the wafer 40A is in the stage after being applied a photolithography process and is required to be washed. That is, the surface 41A to be washed of the wafer 40A is disposed with a patterned photoresist 42A. In some embodiments, the patterned photoresist 42A is an organic polymer and is a hydrophobic substance. The patterned photoresist 42A may be formed by a method as follows. A photoresist (not shown) is formed on the wafer 40A, then an exposure process is applied to the photoresist, and then part of the photoresist is dissolved by a developer to obtain the patterned photoresist 42A. However, the part of the photoresist dissolved by the developer may partially remain on the wafer 40A (hereinafter, the part of the photoresist dissolved by the developer and partially remaining on the wafer 40A is referred as a residue), which affects the properties and yield of the final semiconductor device. Therefore, the control module 20 is configured to perform the steps shown in FIG. 2 to FIG. 5 to remove the residue on the wafer 40A. Unless otherwise specified below, the execution subject of each of the steps is the control module 20.

Figure 2:
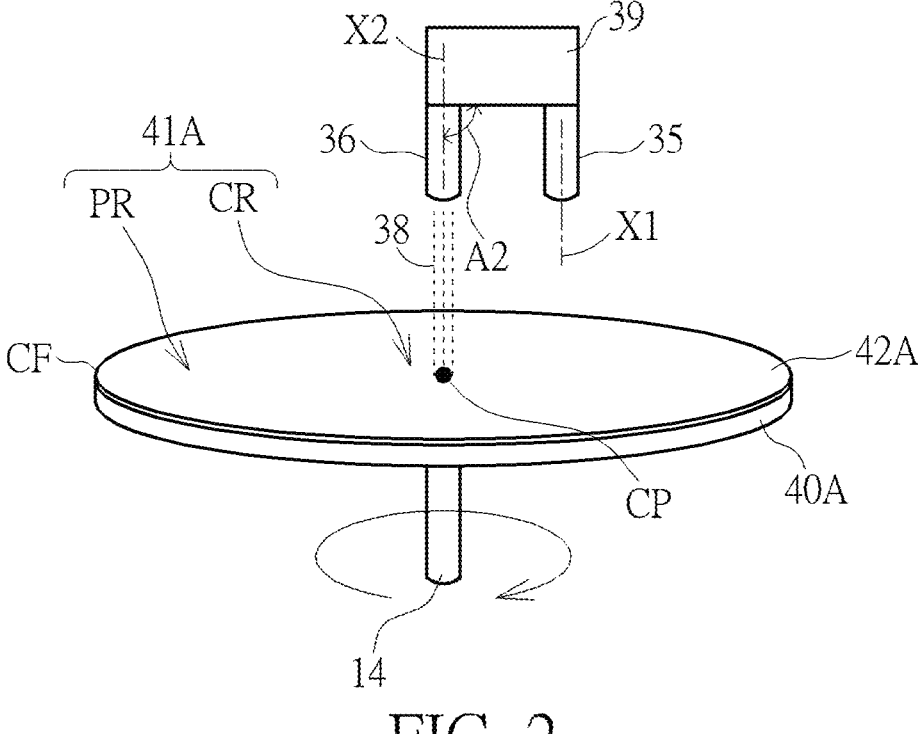
FIG. 2, FIG. 3, FIG. 4 and FIG. 5 are schematic diagrams showing steps of a wafer cleaning method according to an embodiment of the present disclosure.

Please refer to FIG. 1 and FIG. 2. First, the carrier 13 is rotated to bring the wafer 40A to rotate therewith. As shown in FIG. 2, a cleaning liquid may be optionally sprayed onto the central region CR of the surface 41A to be washed in first, and the cleaning liquid together with the residue are initially removed by the centrifugal force caused by the rotation of the wafer 40A. In this embodiment, the type of the cleaning liquid in this step is identical to the type of the second fluid 38. Therefore, in FIG. 2, the control module 20 controls the fluid supply module 30 to provide the second fluid 38 to be sprayed onto the surface 41A to be washed through the second nozzle 36. In this embodiment, the cleaning liquid in this step and the second fluid 38 are both deionized water. The deionized water has polarity and thus is a polar cleaning liquid. However, the present disclosure is not limited thereto. The cleaning liquid in this step may be identical to or different from the second fluid 38 according to actual needs, such as the properties of the residue. When the cleaning liquid in this step is different from the second fluid 38, the wafer cleaning system 10 may further include a third nozzle (not shown), and the cleaning liquid in this step may be sprayed onto the surface 41A to be washed through the third nozzle.

In this step, the included angle A2 between the second nozzle 36 and the fixed seat 39 is 90 degrees, and the central axis X2 of the second nozzle 36 is aligned with the central region CR of the surface 41A to be washed, and is preferably aligned with the central point CP of the surface 41A to be washed (i.e., the center of the wafer 40A). Thereby, it is favorable for uniformly cleaning the wafer 40A in all directions.

Next, as shown in FIG. 3, continue to rotate the carrier 13. The fluid supply module 30 is controlled to provide the first fluid 37 and the second fluid 38 to spray onto the surface 41A to be washed respectively through the first nozzle 35 and the second nozzle 36 while the wafer 40A is rotated. The first fluid 37 is a gas. Herein, the first fluid 37 is exemplary nitrogen for drying the surface 41A to be washed. The second fluid 38 is a cleaning liquid. Herein, the second fluid 38 is exemplary deionized water. The first nozzle 35 is closer to a central point CP of the surface 41A to be washed than the second nozzle 36. The first nozzle 35 is preferably aligned with the central point CP of the surface 41A to be washed. The first nozzle 35 being aligned with the central point CP of the surface 41A to be washed may refer that the central axis X1 of the first nozzle 35 passes through the central point CP.

In FIG. 3, the first nozzle 35 is disposed vertically on the fixed seat 39, and the second nozzle 36 is disposed obliquely on the fixed seat 39. That is, an included angle A1 between the first nozzle 35 and the fixed seat 39 may be 90 degrees, and an included angle A2 between the second nozzle 36 and the fixed seat 39 may be less than 90 degrees, such as 30 degrees to 60 degrees. There is a spaced distance SD between the first nozzle 35 and the second nozzle 36. The spaced distance SD may be the distance between the central axis X1 at the opening of the terminal end of the first nozzle 35 and the central axis X2 at the opening of the terminal end of the second nozzle 36. In this case, the first nozzle 35 and the second nozzle 36 are located at the first position. For example, the first nozzle 35 is located at the position P1.

Figure 4:
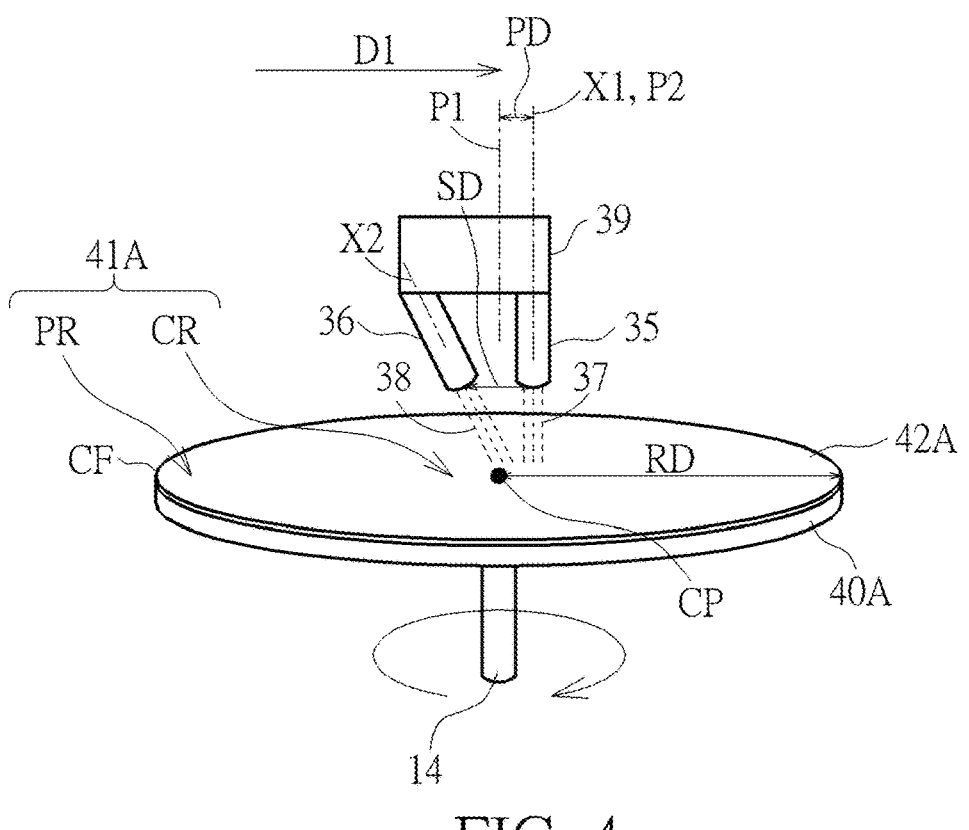

Next, as shown in FIG. 4, continue to rotate the carrier 13. The first nozzle 35 and the second nozzle 36 are controlled to move a predetermined distance PD from the central region CR of the surface 41A to be washed along a first direction D1 away from the central region CR while the wafer 40A is rotated. For example, the first nozzle 35 is located at the position P2. The predetermined distance PD may be less than the radius RD of the wafer 40A. Thereby, it is favorable for removing the residue in the central region CR. According to an embodiment of the present disclosure, the predetermined distance PD may be a half of the spaced distance SD. Therefore, when the first nozzle 35 is aligned with the central point CP of the surface 41A to be washed at the position P1, the midpoint (not labeled) of the spaced distance SD may be aligned with the central point CP of the surface 41A to be washed after the first nozzle 35 and the second nozzle 36 are controlled to move the predetermined distance PD. Thereby, the ability for removing the residue at the central point CP may be further improved. The spaced distance SD may be, for example, 10 millimeters (mm) to 12 mm, and the predetermined distance PD may be, for example, 5 mm to 6 mm.

According to an embodiment of the present disclosure, the first nozzle 35 and the second nozzle 36 may be controlled to stay at a predetermined position for a predetermined period. Thereby, the ability for removing the residue in the central region CR may be further improved. For example, the predetermined period may be 3 seconds to 8 seconds, but not limited thereto.

Figure 5:
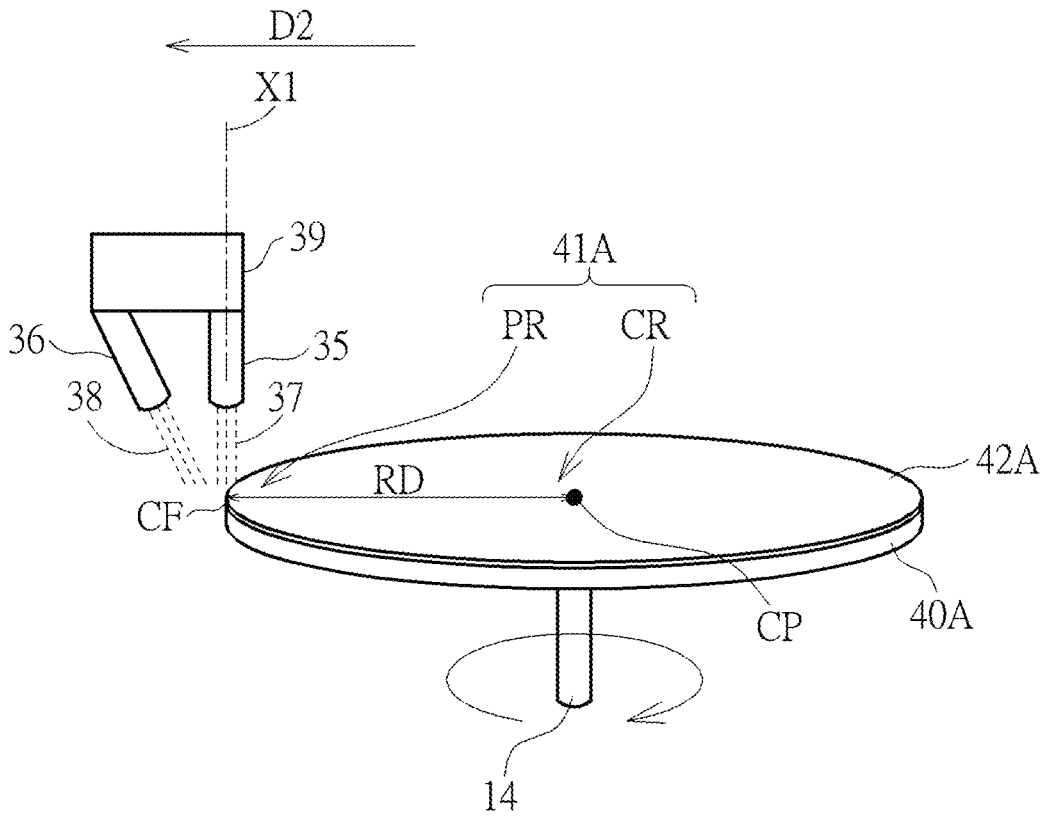

Next, as shown in FIG. 5, continue to rotate the carrier 13. The first nozzle 35 and the second nozzle 36 are controlled to move along the second direction D2 opposite to the first direction D1 to the peripheral region PR of surface 41A to be washed while the wafer 40A is rotated. For example, the first nozzle 35 and the second nozzle 36 may be controlled to move from the predetermined position in FIG. 4 along the second direction D2 to the circumference CF or outside the circumference CF of the surface 41A to be washed in a scanning manner. For example, the central axis X1 of the first nozzle 35 is aligned with the circumference CF of the surface 41A to be washed, or the central axis X1 of the first nozzle 35 no longer passes through the surface 41A to be washed. In other words, in FIG. 5, the distance that the first nozzle 35 and the second nozzle 36 move along the second direction D2 is greater than or equal to the sum of the predetermined distance PD and the radius RD. In addition, the steps shown in FIG. 4 and FIG. 5 may be performed only one time, or may be repeated multiple times depending on actual needs.

According to an embodiment of the present disclosure, the rotating speed of the wafer 40A may be 2000 rpm (revolution(s) per minute) to 2500 rpm. In addition, the rotating speeds of the wafer 40A in FIG. 2 to FIG. 5 may be the same. Thereby, the operating process may be simplified, but not limited thereto. In FIG. 2 to FIG. 5, the control module 20 controls the first nozzle 35 and the second nozzle 36 to move through controlling the fixed seat 39 to move. Therefore, the moving rate of the first nozzle 35 is identical to the moving rate of the second nozzle 36. According to an embodiment of the present disclosure, the moving rates of the first nozzle 35 and the second nozzle 36 may be 160 mm/s to 240 mm/s. In addition, the moving rates of the first nozzle 35 in the steps shown in FIG. 4 and FIG. 5 may be the same. Thereby, the operating process may be simplified, but not limited thereto. According to an embodiment of the present disclosure, the ratio of the flow rate of the first fluid 37 to the flow rate of the second fluid 38 may be 13.5 to 14.5. The flow rate of the first fluid 37 may be 4000 ml/min to 6000 ml/min, such as 5000 ml/min. The flow rate of the second fluid 38 may be 280 ml/min to 420 ml/min, such as 350 ml/min.

In general, when removing the residue on the surface 41A to be washed, the cleaning liquid may be sprayed to the central region CR of the surface 41A to be washed while the wafer 40A is rotated, and the residue together with the cleaning liquid may be removed by the centrifugal force caused by the rotation of the wafer 40A, as shown in FIG. 2. However, according to the formula of the centrifugal force, the centrifugal force in the central region CR of the surface 41A to be washed is smaller than the centrifugal force in the peripheral region PR of the surface 41A to be washed. Even more, the centrifugal force at the central point CP of the surface 41A to be washed is 0. As a result, the residue in the central region CR, especially the residue at the central point CP, are not easily removed. In the present disclosure, with controlling the first nozzle 35 and the second nozzle 36 to move the predetermined distance PD from the central region CR of the surface 41A to be washed along the first direction D1 away from the central region CR, and then controlling the first nozzle and the second nozzle to move along the second direction D2 opposite to the first direction D1 to the peripheral region PR of the surface 41A to be washed, it is beneficial to remove the residue in the central region CR, so as to significantly improve the effect of cleaning the wafer 40A. Accordingly, the properties and yield of the semiconductor device subsequently formed can be improved. In addition, when the difference between the polarities of the residue and the cleaning liquid is large, such as the residue being a hydrophobic substance and the cleaning liquid being a polar cleaning liquid, it is not easy to remove the hydrophobic substance completely with the polar cleaning liquid using the step shown in FIG. 2 alone. In the present disclosure, with the steps shown in FIG. 4 and FIG. 5, the effect of removing the hydrophobic substance by the polar cleaning liquid can be improved.

In addition, the predetermined distance PD may be smaller than the radius RD. Compared with controlling the first nozzle 35 and the second nozzle 36 in a scanning manner, in which the first nozzle 35 and the second nozzle 36 are controlled to move a distance of the radius RD from the central point CP of the surface 41A to be washed along the first direction D1 to the circumference CF of the surface 41A to be washed, and then the first nozzle 35 and the second nozzle 36 are controlled to move from the circumference CF of the surface 41A to be washed along the second direction D2 to the circumference CF of the surface 41A at the opposite side, the present disclosure can improve the effect of cleaning the residue in the central region CR with a shorter cleaning route. Accordingly, the cleaning efficiency can be significantly improved and the cleaning cost can be reduced.

In the present disclosure, the central region CR may refer to the circular region covered by 20% of the radius RD starting from the central point CP (i.e., the circular region with the central point CP being the center and the length of 20% of the radius RD being the radius). The peripheral region PR may refer to the annular region covered by 20% of the radius RD starting from the circumference CF.

Please refer to FIG. 6, which is a flow chart showing steps of a wafer cleaning method 100 according to an embodiment of the present disclosure. The wafer cleaning method 100 includes steps 102, 104, 106, 110, 112, and 116, and may optionally include steps 108 and 114. In Step 102, a wafer is provided, wherein the wafer includes a surface to be washed. In Step 104, a first nozzle and a second nozzle disposed above the surface to be washed are provided. In Step 106, the wafer is rotated. In Step 108, a cleaning liquid is sprayed onto the central region of the surface to be washed. In Step 110, a first fluid and a second fluid are provided to spray onto the surface to be washed respectively through the first nozzle and the second nozzle. In Step 112, the first nozzle and the second nozzle are controlled to move a predetermined distance from a central region of the surface to be washed along a first direction away from the central region, wherein the first nozzle and the second nozzle move the predetermined distance to a predetermined position. In Step 114, the first nozzle and the second nozzle are controlled to stay at the predetermined position for a predetermined period. In Step 116, the first nozzle and the second nozzle are controlled to move along a second direction opposite to the first direction to a peripheral region of the surface to be washed. For other details of the wafer cleaning method 100, references may be made to the above description and are omitted herein.

Compared with the prior art, in the wafer cleaning method and the wafer cleaning system according to the present disclosure, with controlling the first nozzle and the second nozzle to move a predetermined distance from a central region of the surface to be washed along a first direction away from the central region, and then controlling the first nozzle and the second nozzle to move along a second direction opposite to the first direction to a peripheral region of the surface to be washed, it is beneficial to remove the residue in the central region, which can improve the effect of cleaning the wafer. Accordingly, the properties and yield of semiconductor device subsequently formed can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer cleaning method, comprising:

providing a wafer comprising a surface to be washed;

providing a first nozzle and a second nozzle disposed above the surface to be washed;

rotating the wafer;

providing a first fluid onto the surface from the first nozzle, wherein the first fluid is a gas;

providing a second fluid onto the surface from the second nozzle, wherein the second fluid is a cleaning liquid;

controlling the first nozzle to eject the gas onto a central region of the wafer while the second nozzle ejects the cleaning liquid onto the central region and while the combination of the first nozzle and the second nozzle is located at a first position, wherein the first position of said combination is a position wherein the first nozzle is closer to a center point of the wafer than the second nozzle;

performing a first movement of the first and second nozzles such that the combination of the first and second nozzles moves a predetermined distance from the first position to a second position, wherein the predetermined distance is less than a radius of the wafer, wherein the first movement moves the first nozzle away from the center point of the wafer wherein the first movement moves the combination of the first and second nozzles in a first direction, and wherein the second nozzle ejects the cleaning liquid during the first movement;

stopping movement of the combination of the first and second nozzles in the first direction once the combination reaches the second position;

performing a second movement of the first and second nozzles such that the combination of the first and second nozzles is moved from the second position, wherein the second movement moves the combination of the first and second nozzles in a second direction that is opposite to the first direction, and wherein the second movement comprises the second nozzle ejecting the cleaning liquid onto the wafer throughout a scan of the second nozzle from the central region to a peripheral edge of the wafer.

2. The wafer cleaning method of claim 1, wherein there is a spaced distance between the first nozzle and the second nozzle, and the predetermined distance is a half of the spaced distance.

3. The wafer cleaning method of claim 1, wherein the gas is a gas for drying the surface to be washed.

4. The wafer cleaning method of claim 3, wherein a hydrophobic substance is disposed on the surface to be washed, and the cleaning liquid is a polar cleaning liquid.

5. The wafer cleaning method of claim 1, wherein the wafer cleaning method further comprises:

controlling the combination of the first nozzle and the second nozzle to stay at the second position for a predetermined period.

6. The wafer cleaning method of claim 5, wherein the predetermined period is 3 seconds to 8 seconds.

7. The wafer cleaning method of claim 1, wherein before providing the first fluid and the second fluid onto the surface to be washed, the wafer cleaning method further comprises:

spraying a cleaning liquid onto the central region of the surface to be washed.

8. The wafer cleaning method of claim 1, wherein a moving rate of the first nozzle is identical to a moving rate of the second nozzle.

9. The wafer cleaning method of claim 1, wherein a rotating speed of the wafer is 2000 rpm to 2500 rpm, and a moving rate of the first nozzle is 160 mm/s to 240 mm/s.

10. A wafer cleaning system, comprising:

a holder for holding a wafer, wherein the wafer comprises a surface to be washed;

a first nozzle disposed above the surface to be washed;

a second nozzle disposed above the surface to be washed; and a fluid supply module connected with the first nozzle and the second nozzle; and a control module connected with the holder, the first nozzle, the second nozzle and the fluid supply module, the control module configured to:

rotate the holder to bring the wafer to rotate therewith;

control the fluid supply module to provide a first fluid to the first nozzle, wherein the first fluid is a gas;

control the fluid supply module to provide a second fluid to the second nozzle, wherein the second fluid is a cleaning liquid;

control the first nozzle to eject the gas onto a central region of the wafer while the second nozzle ejects the cleaning liquid onto the central region and while the combination of the first nozzle and the second nozzle is located at a first position, wherein the first position of said combination is a position wherein the first nozzle is closer to a center point of the wafer than the second nozzle while the wafer is held by the holder;

control a first movement of the first and second nozzles such that the combination of the first and second nozzles moves a predetermined distance from the first position to a second position, wherein the predetermined distance is less than a radius of the wafer, wherein the first movement moves the first nozzle away from the center point of the wafer, wherein the first movement moves the combination of the first and second nozzles in a first direction, and wherein the second nozzle ejects the cleaning liquid during the first movement;

stop movement of the combination of the first and second nozzles in the first direction once the combination reaches the second position;

control a second movement of the first and second nozzles such that the combination of the first and second nozzles is moved from the second position, wherein the second movement moves the combination of the first and second nozzles in a second direction that is opposite to the first direction, and wherein the second movement comprises the second nozzle ejecting the cleaning liquid onto the wafer throughout a scan of the second nozzle from the central region to a peripheral edge of the wafer.

11. The wafer cleaning system of claim 10, wherein there is a spaced distance between the first nozzle and the second nozzle, and the predetermined distance is a half of the spaced distance.

12. The wafer cleaning system of claim 10, wherein the gas is a gas for drying the surface to be washed.

13. The wafer cleaning system of claim 12, wherein a hydrophobic substance is disposed on the surface to be washed, and the cleaning liquid is a polar cleaning liquid.

14. The wafer cleaning system of claim 10, wherein the control module is further configured to:

control the combination of the first nozzle and the second nozzle to stay at the second position for a predetermined period.

15. The wafer cleaning system of claim 14, wherein the predetermined period is 3 seconds to 8 seconds.

16. The wafer cleaning system of claim 10, wherein a moving rate of the first nozzle is identical to a moving rate of the second nozzle.

* * * * *